(12) United States Patent
Chandra Sekar et al.

(10) Patent No.: US 8,026,170 B2
(45) Date of Patent: Sep. 27, 2011

(54) METHOD OF FORMING A SINGLE-LAYER METAL CONDUCTORS WITH MULTIPLE THICKNESSES

(75) Inventors: Deepak Chandra Sekar, Atlanta, GA (US); Nima Mokhlesi, Los Gatos, CA (US)

(73) Assignee: SanDisk Technologies Inc., Plano, TX (US)

( * ) Notice: Subject to any disclaimer, the term of this patent is extended or adjusted under 35 U.S.C. 154(b) by 243 days.

(21) Appl. No.: 11/861,994

(22) Filed: Sep. 26, 2007

(65) Prior Publication Data

US 2009/0080229 A1    Mar. 26, 2009

(51) Int. Cl.
*H01L 21/4763* (2006.01)

(52) U.S. Cl. ............... 438/637; 438/638; 257/E21.577; 257/E27.579

(58) Field of Classification Search .................. 438/584, 438/637–639, 597; 257/E21.579, E21.577, 257/E21.678
See application file for complete search history.

(56) References Cited

U.S. PATENT DOCUMENTS

| | | | |
|---|---|---|---|
| 5,070,032 A | 12/1991 | Yuan et al. | 438/267 |
| 5,095,344 A | 3/1992 | Harari | 257/328 |
| 5,313,421 A | 5/1994 | Guterman et al. | 365/185.15 |
| 5,315,541 A | 5/1994 | Harari et al. | 365/185.13 |
| 5,343,063 A | 8/1994 | Yuan et al. | 257/317 |
| 5,570,315 A | 10/1996 | Tanaka et al. | 365/185.22 |
| 5,661,053 A | 8/1997 | Yuan | 438/257 |
| 5,774,397 A | 6/1998 | Endoh et al. | 365/185.19 |
| 6,046,935 A | 4/2000 | Takeuchi et al. | 365/185.03 |
| 6,136,686 A | 10/2000 | Gambino et al. | 438/624 |
| 6,222,762 B1 | 4/2001 | Guterman et al. | 365/185.03 |
| 6,522,580 B2 | 2/2003 | Chen et al. | 365/185.02 |
| 6,815,820 B2 | 11/2004 | Yu et al. | 257/758 |
| 7,071,099 B1 | 7/2006 | Greco et al. | 438/638 |
| 7,214,611 B2 | 5/2007 | Liu et al. | 438/637 |
| 2004/0224261 A1* | 11/2004 | Resnick et al. | 430/311 |
| 2005/0018526 A1* | 1/2005 | Lee | 365/232 |
| 2005/0170269 A1* | 8/2005 | Nakagawa et al. | 430/30 |
| 2005/0202350 A1* | 9/2005 | Colburn et al. | 430/320 |
| 2006/0076717 A1* | 4/2006 | Sreenivasan et al. | 264/494 |
| 2006/0145227 A1* | 7/2006 | Willer | 257/296 |
| 2006/0197228 A1 | 9/2006 | Daubenspeck et al. | 257/773 |
| 2006/0261518 A1* | 11/2006 | Willson et al. | 264/293 |

OTHER PUBLICATIONS

Wei-Lun Jen et al., "Multi-level Step and Flash Imprint Lithography for Direct Patterning of Dielectrics," Proceedings of SPIE, vol. 6517, Mar. 2007, 9 pages.

* cited by examiner

*Primary Examiner* — Khiem D Nguyen
(74) *Attorney, Agent, or Firm* — Vierra Magen Marcus & DeNiro LLP

(57) ABSTRACT

A pattern that includes trenches of different depths is formed on a substrate using nanoimprint lithography. A subsequent metal deposition forms lines of different thicknesses according to trench depth, from a single metal layer. Vias extending down from lines are also formed from the same layer. Individual bit lines are formed having different thicknesses at different locations.

25 Claims, 8 Drawing Sheets

METHOD OF FORMING A SINGLE-LAYER METAL CONDUCTORS WITH MULTIPLE THICKNESSES

BACKGROUND

This invention relates to nonvolatile memories and methods of forming nonvolatile memories. In particular, this application relates to nonvolatile memory arrays in which floating gate memory cells individually hold one or more bits of data.

Nonvolatile memory systems are used in various applications. Some nonvolatile memory systems are embedded in a larger system such as a personal computer. Other nonvolatile memory systems are removably connected to a host system and may be interchanged between different host systems. Examples of such removable memory systems include memory cards and USB flash drives. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards. There are several USB flash drive products commercially available from SanDisk Corporation under its trademark "Cruzer®." USB flash drives are typically larger and shaped differently than the memory cards described above.

Different types of memory array architecture are used in nonvolatile memory systems. In one type of architecture, a NAND array, a series of strings of more than two memory cells, such as 16 or 32, are connected along with one or more select transistors between individual bit lines and a reference potential to form columns of cells. Word lines extend across cells within a large number of these columns. Typically word lines, bit lines and other similar conductive components are formed by patterning a conductive layer using a pattern established by photolithography.

SUMMARY

A method of forming an integrated circuit according to an embodiment of the present invention comprises: forming a resist layer over a substrate surface; pressing a template into the resist layer to form a first trench that is elongated in a direction parallel to the substrate surface, the first trench having a first depth in the resist layer, and a second trench that is elongated in a direction parallel to the substrate surface, the second trench having a second depth in the resist layer; subsequently removing the template from the resist layer to expose the first trench and the second trench; depositing a layer of conductive material to fill the first trench and the second trench; and planarizing the conductive material to remove excess conductive material, leaving a first portion of the conductive material in the first trench and a second portion of the conductive material in the second trench, the first portion of material having a first resistance per unit length and the second portion of material having a second resistance per unit length.

A memory array according to another embodiment comprises: a plurality of electrically conductive lines that extend across the memory array; a driver circuit connected to a first electrically conductive line of the plurality of electrically conductive lines; and the first electrically conductive line having a first vertical thickness at a first end that is closer to the driver circuit and having a second vertical thickness at a second end that is farther from the driver circuit, the second thickness being less than the first thickness.

A method of forming a nonvolatile memory system according to another embodiment comprises: forming a trench in a dielectric material using nanoimprint lithography, the trench having a first depth at a first location and a second depth at a second location, the first and second depths being less than the thickness of the dielectric material; and forming a bit line by depositing a metal layer over the trench to fill the trench, the bit line having a first vertical thickness at the first location and a second vertical thickness at the second location.

An integrated circuit having conductive lines connecting components according to an embodiment of the present invention, comprises: a first portion of a metal layer that forms a first conductive line, the first conductive line having a uniform first thickness; a second portion of the metal layer that forms a second conductive line, the second conductive line having a second uniform thickness; and a third portion of the metal layer that forms a third conductive line, the third conductive line having different thicknesses at different locations.

DETAILED DESCRIPTION OF ILLUSTRATED EMBODIMENTS

Figure 1:
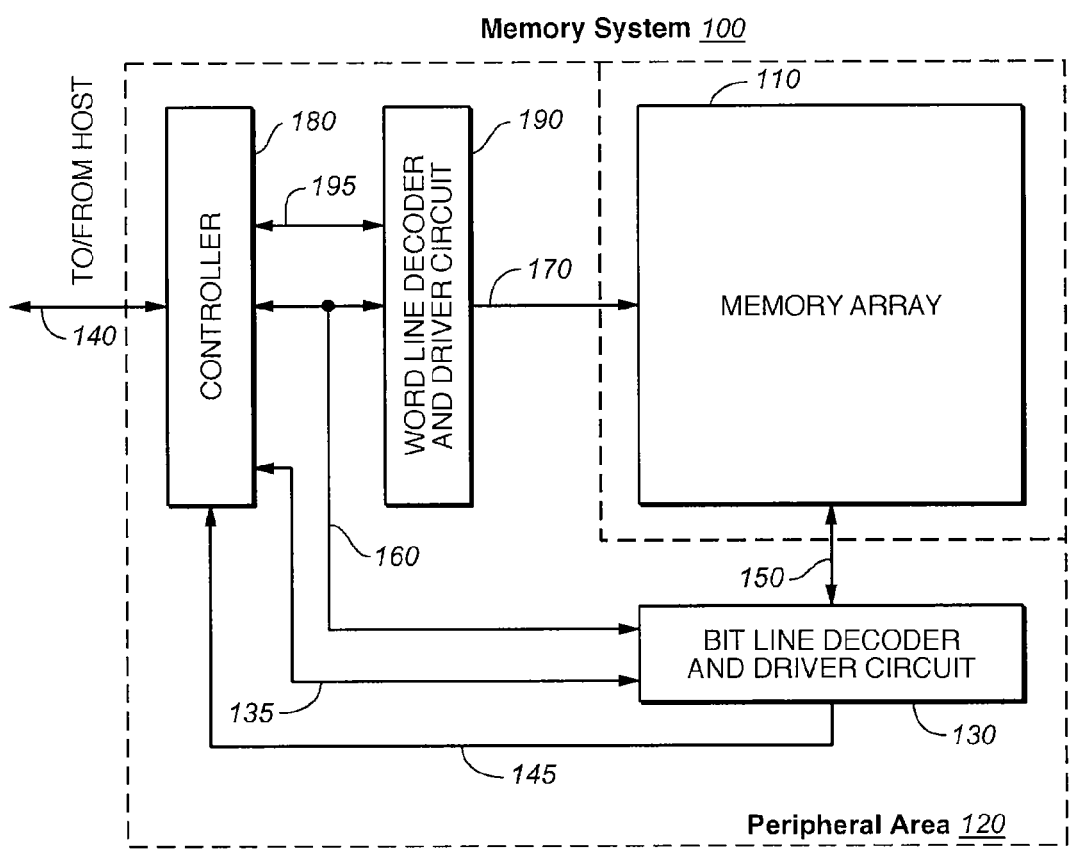
FIG. 1 shows an exemplary memory system that includes a memory array and peripheral circuits.

FIG. 1 shows an example of a memory system 100. A large number of individually addressable memory cells are arranged in a regular array 110 of rows and columns, although other physical arrangements of cells are possible. Bit lines, designated herein to extend along columns of the array 110, are electrically connected with a bit line decoder and driver circuit 130 through lines 150. Word lines, which are designated in this description to extend along rows of the array 110, are electrically connected through lines 170 to a word line decoder and driver circuit 190. Each of the decoders 130 and 190 receives memory cell addresses over a bus 160 from a memory controller 180. The decoder and driving circuits are also connected to the controller 180 over respective control and status signal lines 135 and 195.

The controller 180 is connectable through lines 140 to a host device (not shown). The host may be a personal computer, notebook computer, digital camera, audio player, various other hand held electronic devices, and the like. The memory system 100 of FIG. 1 will commonly be implemented in a card according to one of several existing physical and electrical standards, such as one from the PCMCIA, the CompactFlash™ Association, the MMC™ Association, and others. When in a card format, the lines 140 terminate in a connector on the card that interfaces with a complementary connector of the host device. The electrical interface of many cards follows the ATA standard, wherein the memory system appears to the host as if it was a magnetic disk drive. Other memory card interface standards also exist. In some systems, a memory card may not have a controller and the functions of the controller may be carried out by the host. As an alternative to the card format, a memory system of the type shown in FIG. 1 may be permanently embedded in the host device.

The decoder and driver circuits 130 and 190 generate appropriate voltages in their respective lines of the array 110, as addressed over the bus 160, according to control signals in respective control and status lines 135 and 195, to execute programming, reading and erasing functions. Any status signals, including voltage levels and other array parameters, are provided by the array 110 to the controller 180 over the same control and status lines 135 and 195. A plurality of sense amplifiers within the circuit 130 receive current or voltage levels that are indicative of the states of addressed memory cells within the array 110, and provides the controller 180 with information about those states over lines 145 during a read operation. A large number of sense amplifiers are usually used in order to be able to read the states of a large number of memory cells in parallel. During reading and program operations, one row of cells is typically addressed at a time through the circuits 190 for accessing a number of cells in the addressed row that are selected by the circuit 130. During an erase operation, all cells in each of many rows are typically addressed together as a block for simultaneous erasure.

Two general memory cell array architectures have found commercial application, NOR and NAND. In a typical NOR array, memory cells are connected between adjacent bit line source and drain diffusions that extend in a column direction with control gates connected to word lines extending along rows of cells. A memory cell includes at least one storage element positioned over at least a portion of the cell channel region between the source and drain. A programmed level of charge on the storage elements thus controls an operating characteristic of the cells, which can then be read by applying appropriate voltages to the addressed memory cells. Examples of such cells, their uses in memory systems and methods of manufacturing them are given in the following U.S. Pat. Nos. 5,070,032; 5,095,344; 5,313,421; 5,315,541; 5,343,063; 5,661,053 and 6,222,762.

In a NAND array series strings of more than two memory cells, such as 16, or 32, are connected along with one or more select transistors between individual bit lines and a reference potential to form columns of cells. Word lines extend across cells within a large number of these columns. An individual cell within a column is read and verified during programming by causing the remaining cells in the string to be turned on hard so that the current flowing through a string is dependent upon the level of charge stored in the addressed cell. An example of a NAND architecture array and its operation as part of a memory system is found in the following U.S. Pat. Nos. 5,570,315; 5,774,397; 6,046,935 and 6,522,580. NAND memory devices have been found to be particularly suitable for mass storage applications such as those using removable memory cards.

Figure 2A:
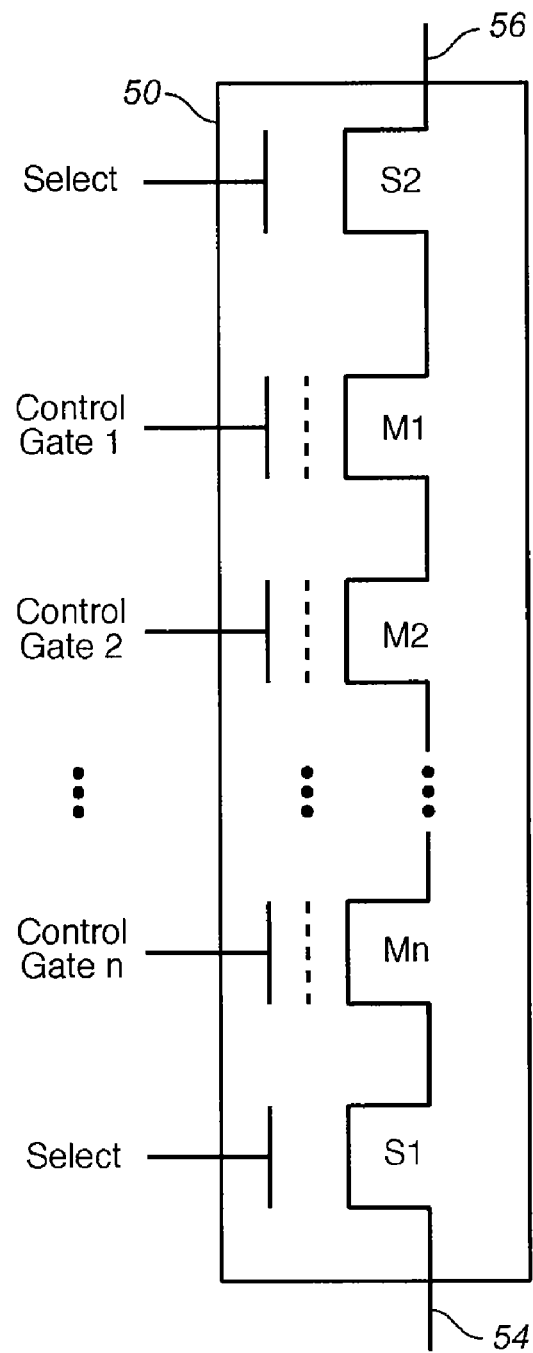
FIG. 2A shows an individual NAND string in the memory array.

FIG. 2A shows a NAND string 50. NAND string 50 includes a select gate at either end so that the string may be selected, and when not selected may be isolated. Between select gates are a string of floating gate memory cells M1-Mn connected in series. Each memory cell, in addition to a floating gate, has a control gate that overlies the floating gate. Control gates are formed where word lines overlie the floating gates. Word lines and floating gates are generally formed together in a self-aligned manner so that coupling between control gates and floating gates is uniform.

Figure 2B:
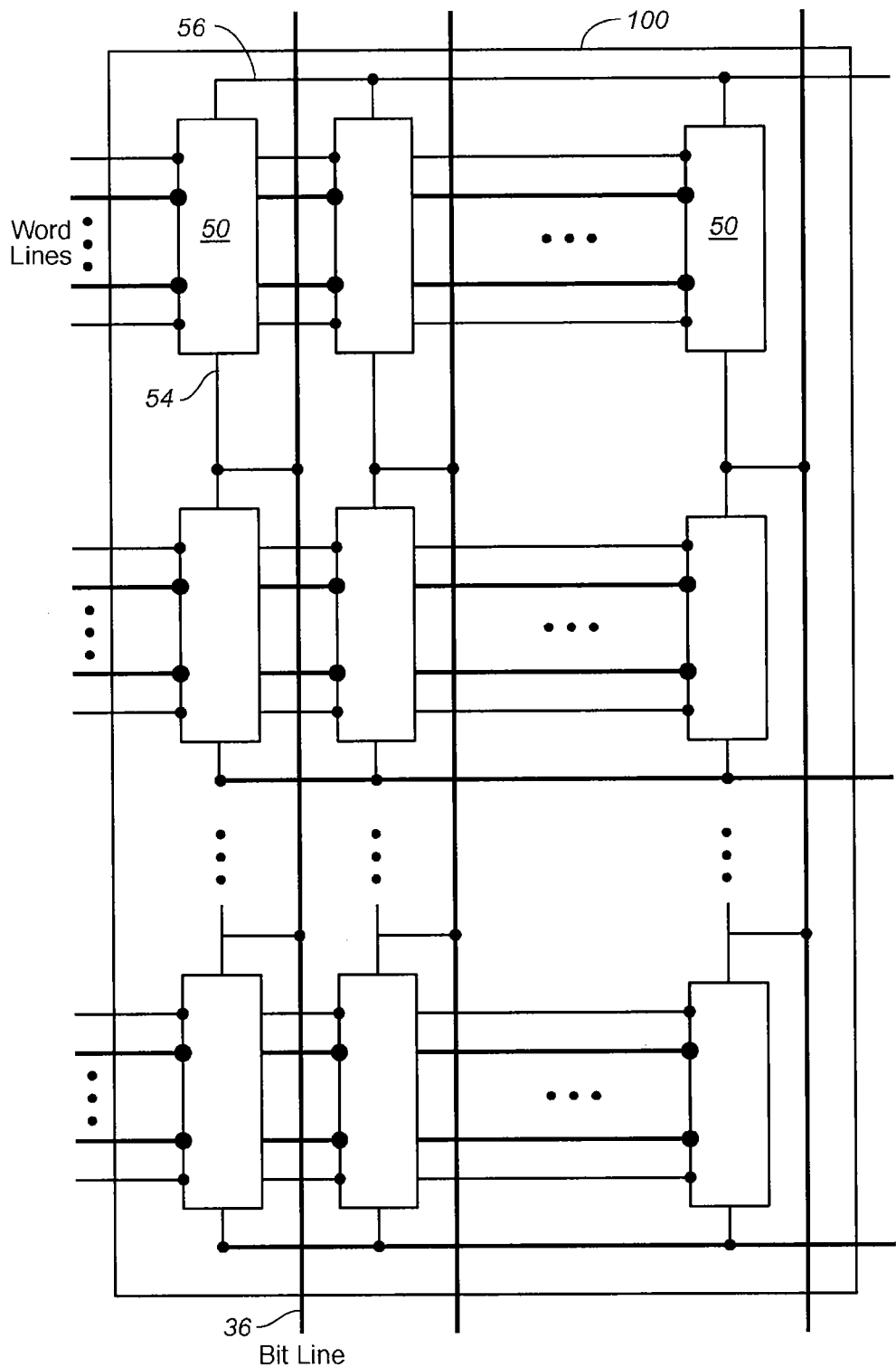
FIG. 2B shows how NAND strings are connected together to form the memory array.

FIG. 2B shows a portion 100 of memory array 110 including multiple NAND strings 50. In particular, FIG. 2B shows how NAND strings are connected together by various conductive lines (wires) to form the memory array. Word lines are shown extending in the horizontal direction, across multiple strings. Word lines form control gates where they overlie floating gates of strings. Select lines also extend in the horizontal direction, forming select gates where they overlie channel regions of strings. Also extending in the horizontal direction are common source lines that connect together the source ends of multiple strings. Bit lines run in the vertical direction. A bit line connection is shared by two strings in this design, though other designs use separate bit line connections for each string (and may share source lines instead). Bit lines extend for relatively long distances in this design and serve a large number of strings. Generally bit lines connect to bit line decoder and driver circuits at one end.

Figure 3:
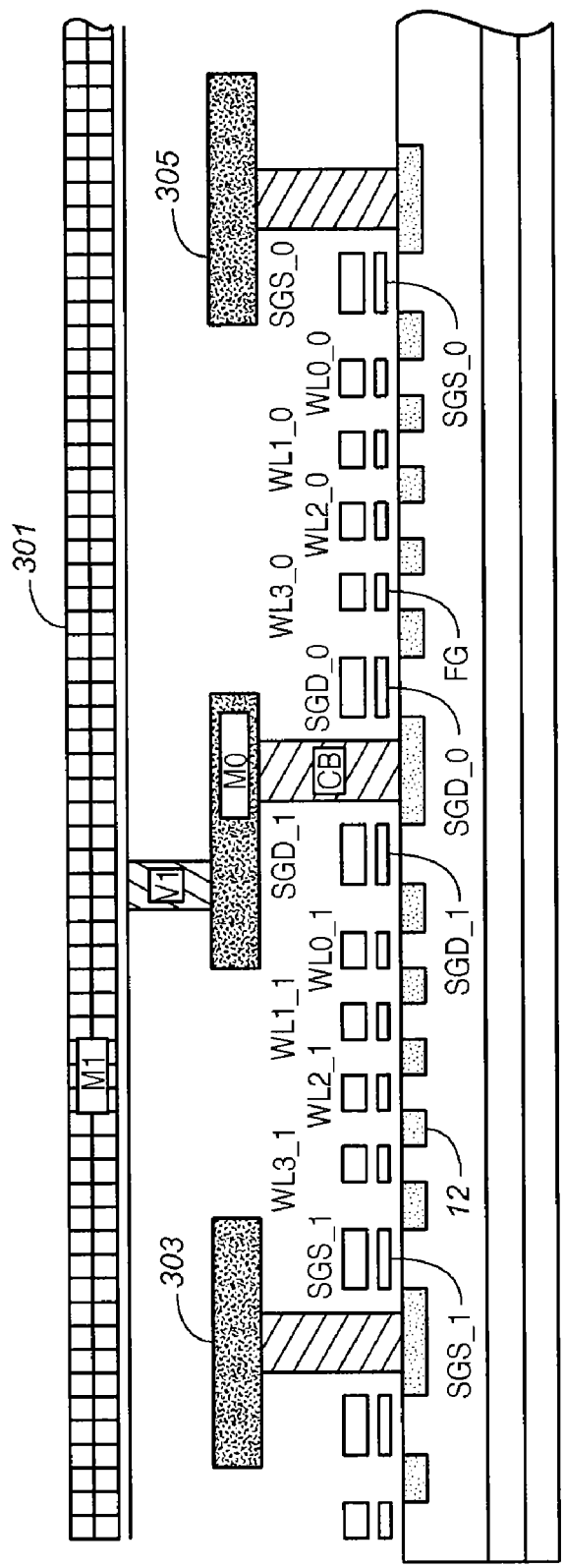
FIG. 3 shows a cross section of a portion of the NAND memory array including a bit line that extends over two NAND strings and is connected to the NAND strings by a via.

FIG. 3 shows a cross section of a portion of a NAND flash memory array along the bit line direction. In particular, FIG. 3 shows a bit line 301 that extends across the NAND array. Bit line 301 is formed from a metal layer (M1) and is connected to NAND strings through vias (V1, CB) and through a lower metal layer (M0). Metal layer M0 also forms common source lines 303, 305 that extend in the direction perpendicular to the cross section shown. Word lines WL3_1, WL2_1, WL1_1, WL0_1, WL3_0, WL2_0, WL1_0, WL1_0, WL0_0 and select lines SGS_1, SGD_1, SGD_0, SGS_0 also extend in the same direction as common source lines 303, 305.

As dimensions shrink in memory arrays, the widths (horizontal dimensions) of conductive components, such as bit lines, word lines, select lines or common source lines are generally reduced, increasing their resistance. The resistance of such conductive elements may have significant effects. For example, the voltage supplied by a bit line may be different for NAND strings at different locations causing misreading of cells. Another significant parameter for long conductors is their capacitance. For example, adjacent bit lines may be capacitively coupled together causing delays in bringing a bit line to its target voltage. As distances between bit lines become smaller, such capacitance may become more significant. In order to keep such capacitance small, it is desirable to reduce the areas of opposing side surfaces of bit lines, which act like plates of a capacitor. However, reducing this area by making lines thinner (reducing their vertical dimension) generally increases their resistance.

Figure 4:
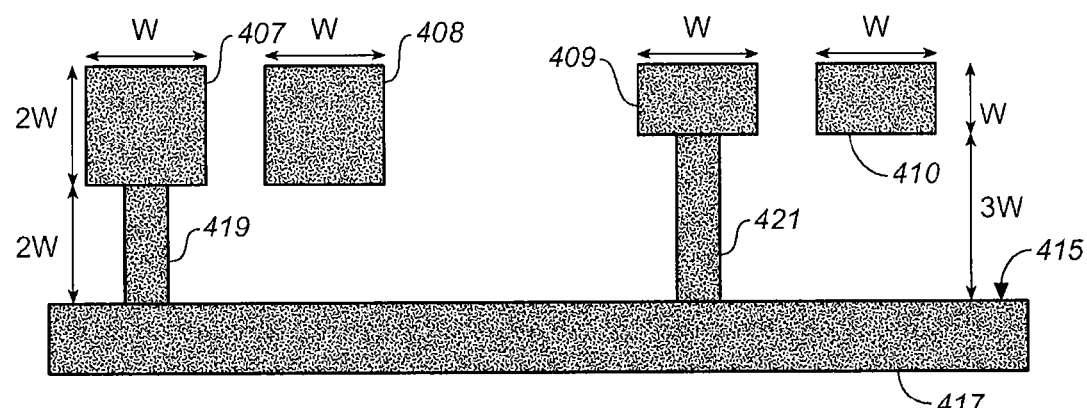
FIG. 4 shows four conductive lines, a first line having a thickness 2W connected to the substrate by a via, a second line having a thickness 2W and no via, a third line having a thickness W connected to the substrate by a via, and a fourth line having a thickness W and no via.

FIG. 4 shows cross-sections of conductive lines 407-410 at different locations. In particular, FIG. 4 shows a first line 407 that has a width W, and a thickness 2W. First line 407 is connected to a surface 415 of a substrate 417 by a via 419 that extends a vertical distance 2W. FIG. 4 also shows a second line 408 that has a width W, a thickness 2W and is a distance 2W from surface 415, without a via connecting it to substrate 417. In general, a line will have a cross section like that of first line 407 at locations where it is connected to a substrate and a cross section like that of second line 408 at other locations, so that cross sections like those of first line 407 and second line 408 could be found along the same line. FIG. 4 also shows third line 409 and a fourth line 410. Third line 409 and fourth line 410 have a thickness W and are a distance from the substrate surface of 3W. Third line 409 is shown at a point where it is connected to substrate surface 415 by a via 421 (in this case the via extends vertically a distance 3W) and fourth line 410 is shown without a via. According to an embodiment of the present invention, a single conductive element such as a bit line is formed to have different thicknesses at different locations. Such lines may be formed by a single deposition so that the process is not overly complex and may be formed using cost effective processing techniques as described further below. Thus, for example, a single conductive element may have a thickness of 2W (like line 408) at some points and may have a thickness of W (like line 410) at other points.

Figure 5:
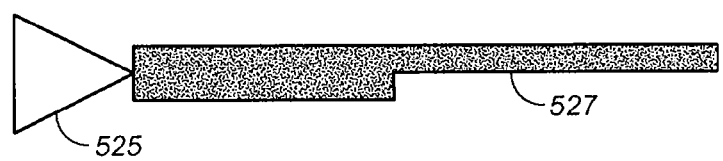
FIG. 5 shows a bit line having a first thickness near a bit line driver and a second thickness away from the driver.

A particular application where a conductive element having different thicknesses at different points may be used is as a conductive line in nonvolatile memory arrays such as a NAND array. In particular, bit lines of NAND arrays extend over relatively long distances and it may be beneficial for such bit lines to have different thicknesses at different points. Bit lines are generally connected to a driver circuit at one end. The driver circuit is used to provide a voltage to the bit line when the memory is being accessed. FIG. 5 shows a driver 525 connected to a bit line 527 that is thicker near driver 525 and thinner away from driver 525. The greater thickness near driver 525 provides lower resistance so that there is less voltage drop. The reduced thickness away from driver 525 provides less capacitance. The point at which bit line 527 changes from being thick to being thin may be chosen according to the acceptable amount of voltage drop along bit line 527 and is not necessarily at a half way point along bit line 527. In other examples, a bit line may have three or more different thicknesses with steps from one thickness to another. In other cases lines may taper continuously so that no steps occur. It should be noted that these examples all control the vertical dimension of the conductive element and in general the horizontal dimensions remain the same. Typically, a bit line has a constant width (lateral dimension) that is the minimum feature size of the patterning process used. However, in some cases, it may be beneficial to vary the width also to reduce resistance near the driver. In other examples, other lines may have varying thicknesses. For example, where word lines are formed by metal conductors, word lines may taper as they extend away from drivers.

In another embodiment, conductive elements of different thicknesses may be formed from the same layer for use in different locations. For example, long conductive elements in a memory array may be relatively thick to keep resistance down, while shorter conductive elements formed from the same layer in the peripheral area around the memory array may be relatively thin to have lower capacitance. While individual conductive elements may have a uniform thickness, different conductive elements may have different thicknesses that are selected according to the tradeoff between resistance and capacitance for the particular conductive element. For example, a controller chip may contain different blocks that perform different functions and which may benefit from having conductors of different thicknesses. Logic circuits of a controller chip generally include conductors that are short so that resistance is not important. Such conductors may be made relatively thin to reduce capacitance. SRAM bit lines on the same controller chip may be relatively long so that resistance is significant. Such bit lines may be made relatively thick to reduce resistance. Using different thicknesses for logic and SRAM in this manner may for example reduce logic power by 30% or increase performance by 8%. Thin conductors in the logic area and thick conductors in the SRAM area may be formed from the same metal layer. In some cases, conductive elements of different uniform thicknesses and conductive elements of varying thickness may be formed from the same metal layer. For example, bit lines in a NAND memory may have varying thickness, while lines in peripheral circuits formed from the same metal layer may have a range of different uniform thicknesses.

Figure 6A:
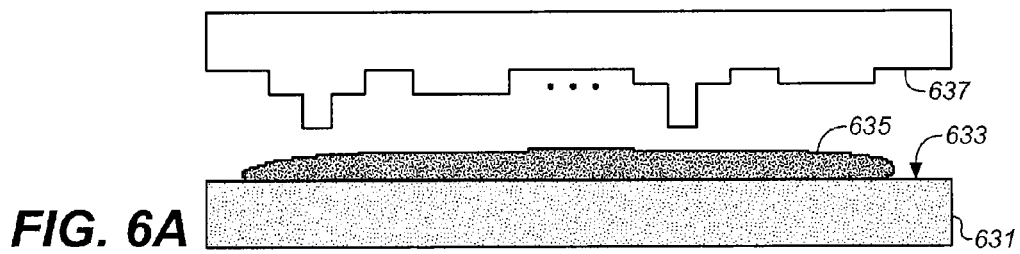
FIG. 6A shows a substrate at an intermediate stage of fabrication according to an exemplary process, with an imprint resist layer covering its upper surface and a template over the resist layer.

FIG. 6A-6E show a process flow for forming conductive lines of different thicknesses according to an exemplary process. FIG. 6A shows a substrate 631, which has a top surface 633 with a resist layer 635 (precursor layer) extending over it. Resist layer 635 is an imprint resist that is spin coated onto substrate 631. A template 637 is shown above resist layer 635. Template 637 has a number of surface features that extend towards resist layer 635. Template 637 is brought down towards substrate 631 so that the surface features of template 637 are pressed into resist layer 635.

Figure 6B:
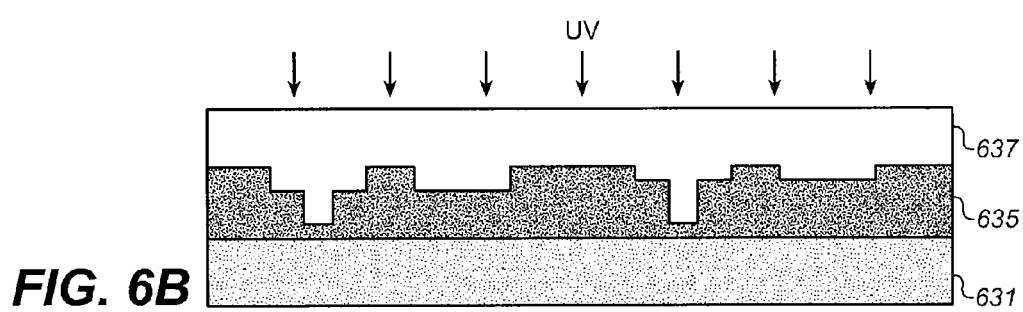
FIG. 6B shows the substrate of FIG. 6A with the template pressed into the resist to form the resist into a desired pattern, and UV light used to cure the resist in this pattern.

FIG. 6B shows template 637 pressed into resist layer 635 so that resist layer 635 takes on the surface profile of template 637. Resist layer 635 is then exposed to ultraviolet light (UV), through template 637, in a photocure step. Template 637 is made of a UV transparent material to allow such light to pass through. In other examples, where different resist material is used, such curing may not be necessary. Once resist layer 635 is cured, template 637 may be withdrawn.

Figure 6C:
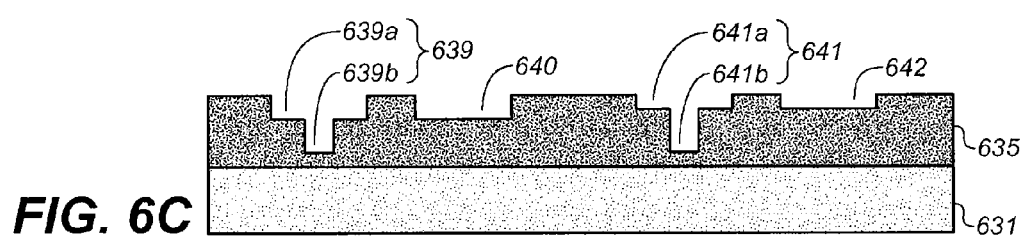
FIG. 6C shows the substrate of FIG. 6B after the template is removed.

FIG. 6C shows resist layer 635 after template 637 is released leaving depressions 639-642 in resist layer 635. Depressions 639-642 are shown in cross section, but they extend in the direction perpendicular to the cross section shown to form extended trenches in the resist layer. Depression 639 is formed by a deep depression 639b (where a via is to be formed) and a thick wire trench 639a, which extends in a direction perpendicular to the cross section shown. Similarly, depression 641 is made up of a deep depression 641b (where a via is to be formed) and a thin wire trench 641a, which extends in a direction perpendicular to the cross section shown. Resist layer 635 is then subjected to etching (e.g. reactive ion etching) to further extend both the trenches and deep depressions.

Figure 6D:
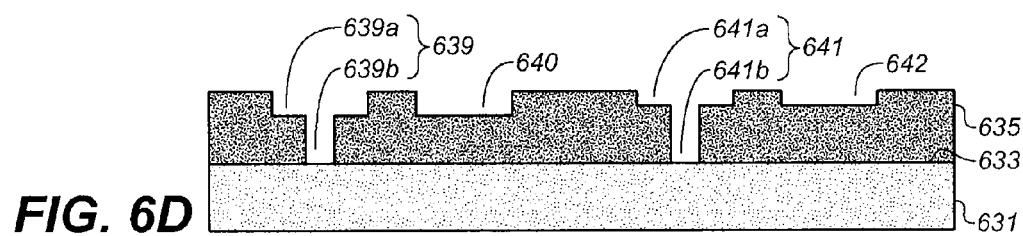
FIG. 6D shows the substrate of FIG. 6C after an etch step to form deep depressions down to the substrate surface where vias are to be formed.

FIG. 6D shows the resist layer 635 after breakthrough via etching is performed, with deep depressions 639b, 641b extending down to surface 633 of substrate 631. The etch may stop when it reaches substrate 631 or some over-etching may be performed to ensure that no resist remains at the bottom of deep depressions 639b, 641b. Subsequently, a metal layer is deposited over the resist layer and is planarized by etchback or CMP to leave metal only in trenches and deep depressions.

Figure 6E:
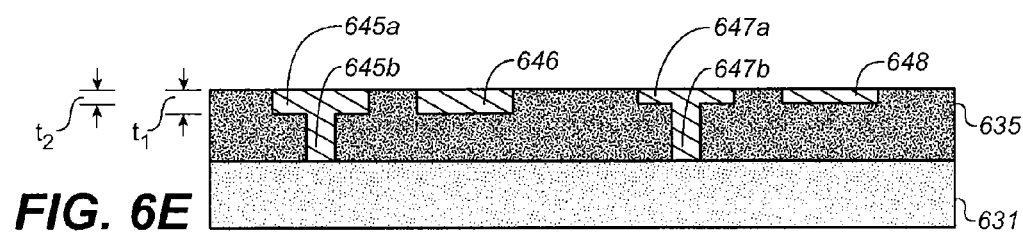
FIG. 6E shows the substrate of FIG. 6D after deposition and planarization of a conductive metal to form conductive lines in trenches and vias in deep depressions.

FIG. 6E shows resist layer 635 after metal is deposited and planarized. The metal in trenches 639a, 640, 641a, 642 forms conductive elements 645a, 646, 647a, 648 respectively. The metal in deep depressions 639b, 641b forms vias 645b, 647b respectively that connect conductive elements 645a, 647a, to substrate 631. As is shown, conductive elements 645a, 646, 647a, 648 have two different thicknesses even though they are formed by the same metal layer. Conductive elements 645a, 646 are thicker than conductive elements 647a, 648. Such conductive elements may be used as previously described, for example with thicker elements in a memory array and thinner elements in peripheral circuits. Also, a single conductive element, such as a bit line, may be formed to have two or more thicknesses at different points. In this example, the resist layer remains in place and becomes a dielectric layer in the integrated circuit. Such a resist material may be considered an Imprintable Dielectric Material (IDM). By using different surface features on a template, trenches of different depths may be formed and an individual trench may have different depths at different locations. Depth may be changed continuously or may be stepped from one thickness to another.

Figure 7A:
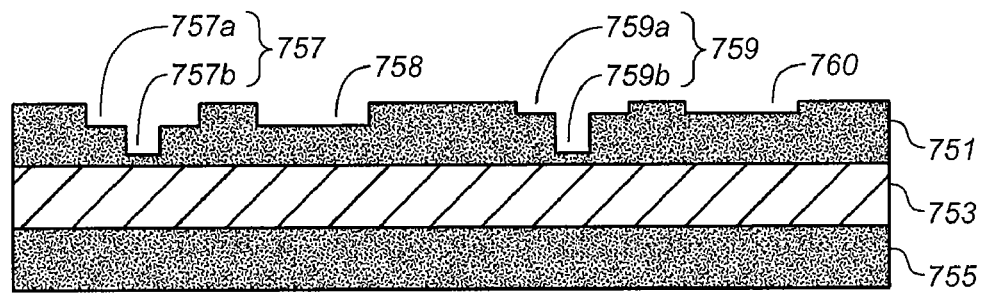
FIG. 7A shows a substrate at in intermediate stage of fabrication according to another exemplary process, with an Interlayer Dielectric (ILD) layer between an imprinted resist layer and an underlying substrate.

FIGS. 7A-7F show another process flow for forming conductive lines of different thicknesses according to another exemplary process. FIG. 7A shows a resist layer 751 that is spun on and imprinted as before. Resist layer 751 has depressions 757-760, including deep depressions 757b, 759b, where vias are to be formed. In this example, an Interlayer Dielectric (ILD) layer 753 lies between substrate 753 and imprinted resist layer 751. The resist material used in this example does not have to be an IDM, and may be any suitable resist. Because the resist material of resist layer 751 is completely removed in this example, the resist material may be considered a Sacrificial Imprint Material (SIM).

Figure 7B:
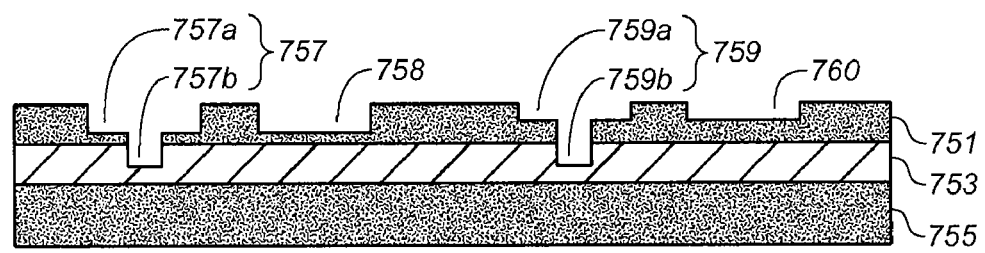
FIG. 7B shows the substrate of FIG. 7A after an etch is performed to extend deep depressions from the imprinted resist layer into the ILD layer.

An initial etch is performed to extend deep depressions 757b, 759b (for vias) into ILD layer 753. This etch removes both resist and ILD material and the etch used may be such that the etch rates for ILD and resist materials are approximately equal. Trenches 757a, 758, 759a, 760 are also deepened by this etch. FIG. 7B shows the result, with deep depressions 757b, 759b extending into ILD layer 753 at locations where vias are to be formed. The depth of deep depressions 757b, 759b are approximately the same at this point. However, the trenches 757a, 758, 759a, 760 have different depths. In particular, trenches 757a, 758 are deeper than trenches 759a, 760. Subsequently, additional etch steps described below are performed to fully transfer the pattern in resist layer 751 to ILD layer 753 so that depressions 757-760 are transferred to ILD layer 753.

Figure 7C:
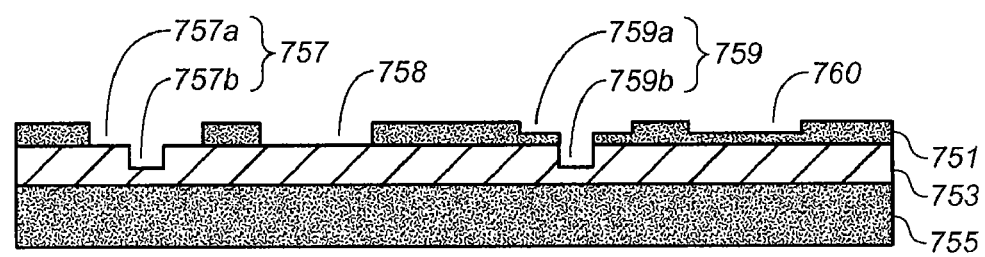
FIG. 7C shows the substrate of FIG. 7B after a descum step is performed to remove residual resist.

FIG. 7C shows substrate 755 after a descum step is performed. A descum step is performed by Reactive Ion Etch (RIE). This step cleans up residual resist and removes portions of resist at the bottom of trenches 757a, 758, exposing the underlying ILD layer 753.

Figure 7D:
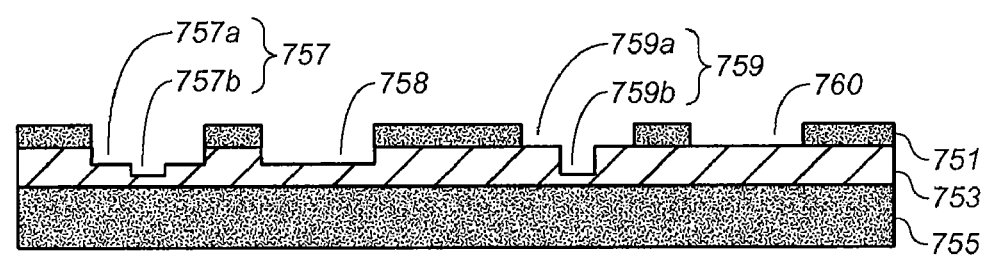
FIG. 7D shows the substrate of FIG. 7C after another etch is performed to etch thin wire trenches down to, or close to, the ILD layer and etch thick wire trenches into the ILD layer.

FIG. 7D shows substrate 755 of FIG. 7C after a thick wire trench etch is performed to etch thick wire trenches 757a, 758 into ILD layer 751. This etch also further deepens thin wire trenches 759a, 760 down to the level of ILD layer 753, or close to it.

Figure 7E:
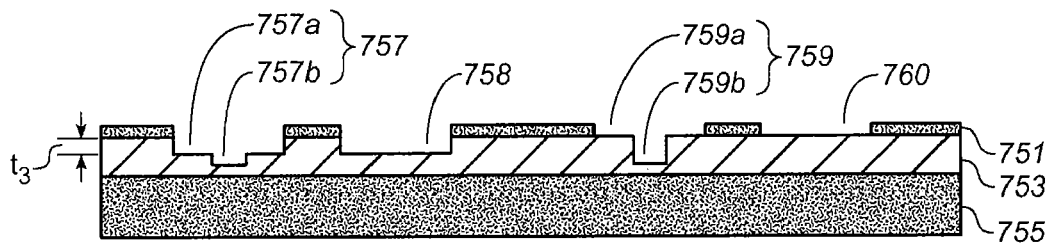
FIG. 7E shows the substrate of FIG. 7D after another descum step is performed to remove residual resist in thin wire trenches over the ILD layer.

FIG. 7E shows substrate 755 of FIG. 7D after a thin wire trench descum step is performed by RIE. This step removes residual resist at the bottom of thin wire trenches 759a, 760 (where the thin wires are to be formed), exposing underlying ILD layer 753 and may also partially etch ILD layer 753. Thick wire trenches 757a, 758 are also further etched, to a depth t3 below resist layer 751, by this step.

Figure 7F:
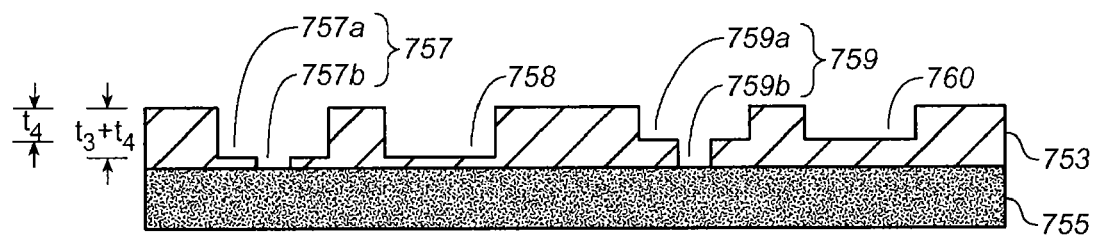
FIG. 7F shows the substrate of FIG. 7E after another etch is performed to extend thin wire trenches down into the ILD layer, and also to further extend thick wire trenches into the ILD layer.

FIG. 7F shows substrate 755 after a thin wire etch is performed to extend the pattern into the ILD layer 753. The thin wire trenches 759a, 760 are shown extending a depth t4 into ILD layer 753 as a result of this etch. Thick wire trenches 757a, 758 are also further etched during this etch step so that thick wire trenches 757a, 758 extend a depth t3+t4. The etch times and etch chemistry may be chosen to obtain desired values for t4. The difference between the depths of thick wire trenches 757a, 758 and thin wire trenches 759a, 760 (t3) is established by the initial nano-imprint patterning. Remaining resist is removed at this point so that unlike the previous example, no resist material remains in the completed integrated circuit, only ILD material remains.

Figure 7G:
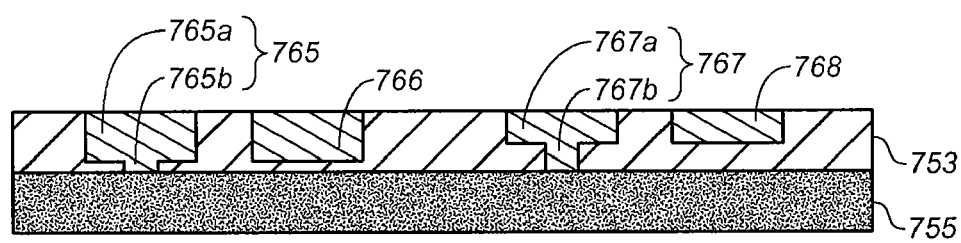
FIG. 7G shows the substrate of FIG. 7F after metal is deposited and planarized to form conductive metal lines in trenches and vias in deep depressions.

FIG. 7G shows substrate 755 after a metal layer is deposited and planarized to leave metal only in the trenches, where it forms conductive lines 765a, 766, 767a, 768, and in deep depressions where it forms vias 765b, 767b. Thus, as before, a single metal layer may be used to form conductors with different vertical thicknesses. This process may be used with any dielectric material (silicon dioxide, silicon nitride, high-k dielectrics, etc.) and is not limited to IDM dielectrics that can be directly imprinted using nanoimprint lithography.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain preferred embodiments, it is understood that the invention is entitled to protection within the full scope of the appended claims.

What is claimed is:

1. A method of forming an integrated circuit, comprising:
   forming a resist layer over a substrate surface;
   pressing a template into the resist layer to form a first trench that is elongated in a direction parallel to the substrate surface, the first trench having a first depth in the resist layer, and a second trench that is elongated in a direction parallel to the substrate surface, the second trench having a second depth in the resist layer, the first depth is different than the second depth;

subsequently removing the template from the resist layer to expose the first trench and the second trench;

depositing a layer of conductive material to fill the first trench and the second trench; and planarizing the conductive material to remove excess conductive material, leaving a first portion of the conductive material in the first trench and a second portion of the conductive material in the second trench to form a continuous conductive horizontal line, the first portion of material having a first resistance per unit length along the continuous conductive horizontal line and the second portion of material having a second resistance per unit length along the continuous conductive horizontal line.

2. The method of claim 1 wherein the trench structure has one or more additional portions having different depths.

3. The method of claim 2 wherein the first portion of material and the second portion of material in the trench structure form a bit line of a memory array.

4. The method of claim 3 wherein the memory array is a NAND flash memory array.

5. The method of claim 1 further comprising, prior to depositing the layer of conductive material, performing an etch that extends the first trench and the second trench into a dielectric layer on the substrate, and removing the resist layer to leave the first trench and the second trench in the dielectric layer.

6. The method of claim 1 wherein the layer of conductive material is deposited in the first trench and the second trench in the resist layer and the resist layer is subsequently kept in place as a dielectric.

7. The method of claim 3 wherein the memory array is a Static Random Access Memory (SRAM).

8. The method of claim 1, wherein the planarizing the conductive material to remove excess conductive material includes planarizing conductive material in the first trench and planarizing conductive material in the second trench.

9. The method of claim 1 further comprising providing a driver coupled to the horizontal line, the first portion is closer to the driver than the second portion.

10. The method of claim 9 wherein the first resistance per unit length along the conductive horizontal line is less than the second resistance per unit length along the conductive horizontal line.

11. A method of forming a nonvolatile memory system, comprising:

forming openings in a dielectric material, the openings extending to a conductive element underlying the dielectric material;

forming a trench in the dielectric material using nanoimprint lithography, the trench having a first portion that is elongated horizontally in the dielectric and a second portion that is elongated horizontally in the dielectric, a first location in the first portion has a first depth and a second location in the second portion has a second depth, the first depth is different from the second depth, the first and second depths being less than the thickness of the dielectric material;

filling the openings with metal to form vias; and forming a bit line by depositing a metal layer over the trench to fill the trench, the bit line having a first vertical thickness at the first location and a second vertical thickness at the second location, the vias are electrically connected to the bit line.

12. The method of claim 11 wherein the dielectric material is spun onto a substrate and forming the trench includes directly imprinting the dielectric material with a template.

13. The method of claim 11 wherein forming the trench includes forming a resist layer over the dielectric material, imprinting the resist layer and transferring a pattern in the imprinted resist layer to the dielectric material.

14. The method of claim 11 wherein the bit line is coupled to a driver, the first location is closer to the driver than the second location.

15. The method of claim 14 wherein the bit line tapers continuously in a direction away from the driver.

16. The method of claim 14 wherein the bit line has one or more steps that reduce the thickness of the bit line further from the driver.

17. The method of claim 14 wherein the resistance per unit length along the bit line at the first location is less than the resistance per unit length along the bit line at the second location.

18. A method of forming an integrated circuit, comprising:

forming a resist layer over a substrate surface;

pressing a template into the resist layer to form a first trench that is elongated in a direction parallel to the substrate surface, the first trench having a first depth in the resist layer, and a second trench that is elongated in a direction parallel to the substrate surface, the second trench having a second depth in the resist layer, the first depth is different than the second depth;

subsequently removing the template from the resist layer to expose the first trench and the second trench;

depositing a layer of conductive material to fill the first trench and the second trench;

planarizing the conductive material to remove excess conductive material, leaving a first portion of the conductive material in the first trench and a second portion of the conductive material in the second trench to form a conductive horizontal line, the first portion of material having a first resistance per unit length along the conductive horizontal line and the second portion of material having a second resistance per unit length along the conductive horizontal line; and providing a driver coupled to the horizontal line, the first portion is closer to the driver than the second portion, the first resistance per unit length along the conductive horizontal line is less than the second resistance per unit length along the conductive horizontal line.

19. The method of claim 18, wherein the first portion of material and the second portion of material in the trench structure form a bit line of a memory array.

20. The method of claim 19 wherein the memory array is a NAND flash memory array.

21. The method of claim 18 further comprising, prior to depositing the layer of conductive material, performing an etch that extends the first trench and the second trench into a dielectric layer on the substrate, and removing the resist layer to leave the first trench and the second trench in the dielectric layer.

22. The method of claim 18 wherein the layer of conductive material is deposited in the first trench and the second trench in the resist layer and the resist layer is subsequently kept in place as a dielectric.

23. A method of forming a nonvolatile memory system, comprising:

forming a trench in a dielectric material using nanoimprint lithography, the trench having a first portion that is elongated horizontally in the dielectric and a second portion that is elongated horizontally in the dielectric, a first location in the first portion has a first depth and a second location in the second portion has a second depth, the first and second depths being less than the thickness of the dielectric material;

forming additional openings in the dielectric material extending from the trench to a conductive element underlying the dielectric material;

filling the additional openings with metal to form vias; and forming a bit line by depositing a metal layer over the trench to fill the trench, the bit line having a first vertical thickness at the first location and a second vertical thickness at the second location, the vias are electrically connected to the bit line, the bit line is coupled to a driver, the first location is closer to the driver than the second location, the resistance per unit length along the bit line at the first location is less than the resistance per unit length along the bit line at the second location.

24. The method of claim 23 wherein the dielectric material is spun onto a substrate and forming the trench includes directly imprinting the dielectric material with a template.

25. The method of claim 23 wherein forming the trench includes forming a resist layer over the dielectric material, imprinting the resist layer and transferring a pattern in the imprinted resist layer to the dielectric material.

* * * * *